(12) United States Patent
Iwai et al.

(10) Patent No.: US 8,231,729 B2
(45) Date of Patent: Jul. 31, 2012

(54) APPARATUS FOR PRODUCING NITRIDE SINGLE CRYSTAL

(75) Inventors: Makoto Iwai, Kasugai (JP); Takanao Shimodaira, Nagoya (JP); Takatomo Sasaki, Suita (JP); Yusuke Mori, Suita (JP); Fumio Kawamura, Suita (JP); Shiro Yamasaki, Nishikasugai-Gun (JP)

(73) Assignees: NGK Insulators, Ltd., Nagoya (JP); Osaka University, Suita (JP); Toyoda Gosei Co., Ltd., Nishikasugai-Gun (JP)

( * ) Notice: Subject to any disclaimer, the term of this patent is extended or adjusted under 35 U.S.C. 154(b) by 1020 days.

(21) Appl. No.: 12/192,428

(22) Filed: Aug. 15, 2008

(65) Prior Publication Data

US 2009/0000542 A1    Jan. 1, 2009

Related U.S. Application Data

(63) Continuation of application No. PCT/JP2007/055785, filed on Mar. 14, 2007.

(30) Foreign Application Priority Data

Mar. 23, 2006   (JP) ................................. 2006-080463

(51) Int. Cl.
   *C30B 11/04*    (2006.01)
(52) U.S. Cl. ............. 117/200; 117/81; 117/82; 117/83; 117/78
(58) Field of Classification Search .................. 117/200, 117/80, 81, 82, 78
   See application file for complete search history.

(56) References Cited

U.S. PATENT DOCUMENTS

| 6,770,135 B2 * | 8/2004 | Schowalter et al. .......... 117/106 |
| 2003/0164138 A1 | 9/2003 | Sarayama et al. |
| 2005/0098090 A1 | 5/2005 | Hirota et al. |
| 2007/0209575 A1 | 9/2007 | Iwai et al. |

FOREIGN PATENT DOCUMENTS

| JP | 06-093452 A1 | 4/1994 |
| JP | 09-115834 A1 | 5/1997 |
| JP | 10-270469 A1 | 10/1998 |
| JP | 2001-085340 A1 | 3/2001 |
| JP | 2002-293696 A1 | 10/2002 |
| JP | 2003-292400 A1 | 10/2003 |
| JP | 2005-132663 A1 | 5/2005 |
| JP | 2005-154254 A1 | 6/2005 |
| WO | WO 2005/095682 A1 | 10/2005 |
| WO | 2006/098458 A1 | 9/2006 |

OTHER PUBLICATIONS

U.S. Appl. No. 12/181,402, filed Jul. 29, 2008, Iwai, et al.
U.S. Appl. No. 12/190,230, filed Aug. 12, 2008, Iwai, et al.
U.S. Appl. No. 12/212,722, filed Sep. 18, 2008, Iwai et al.

(Continued)

*Primary Examiner* — Bob M Kunemund
(74) *Attorney, Agent, or Firm* — Burr & Brown

(57) ABSTRACT

It is disclosed an apparatus for growing a nitride single crystal using a flux containing an easily oxidizable substance. The apparatus has a crucible for storing the flux; a pressure vessel for storing the crucible and charging an atmosphere containing at least nitrogen gas; furnace materials disposed within the pressure vessel and out of the crucible; heaters attached to the furnace material; and alkali-resistant and heat-resistant metallic layers covering the furnace material.

4 Claims, 3 Drawing Sheets

OTHER PUBLICATIONS

U.S. Appl. No. 12/234,786, filed Sep. 22, 2008, Imai et al.
U.S. Appl. No. 12/234,799, filed Sep. 22, 2008, Imai et al.
U.S. Appl. No. 12/284,470, filed Sep. 22, 2008, Ichimura et al.
Kawamura et al., "*Growth of Large/Low-Dislocation GaN Single Crystal by LPE Growth*," Journal of Japanese Association for Crystal Growth, vol. 32, No. 1, 2005, pp. 3-9.

* cited by examiner

APPARATUS FOR PRODUCING NITRIDE SINGLE CRYSTAL

FIELD OF THE INVENTION

The present invention relates to an apparatus for producing a nitride single crystal using Na flux or the like.

BACKGROUND OF THE INVENTION

Gallium nitride-based III-V nitride, which is attracting attention as an excellent blue light emitting element, is put into practical use in light emitting diode field, and expected also as a light pick-up blue-violet semiconductor laser element. In a process for growing a gallium nitride single crystal by Na flux method, a mixed gas of nitrogen and ammonia is used under a pressure of 10 to 100 atoms, for example, in Japanese Patent Publication No. 2002-293696A. In Japanese Patent Publication No. 2003-292400A, also, the pressure during the growth is 100 atm or less, with 2, 3, and 5 MPa (about 20 atm, 30 atm and 50 atm) being used in working the examples thereof.

On the other hand, the present inventors disclosed a method for efficiently growing a gallium nitride single crystal under a specific condition by use of a hot isostatic pressing (HIP) apparatus in Japanese Patent Application No. 2004-103093 (WO 2005/095682 A1).

In "Growth of Large/Low-Dislocation GaN Single Crystal by LPE Growth" by Kawamura et al. of "Journal of Japanese Association for Crystal Growth" Vol. 32, No. 1, 2005, it is described that when a GaN single crystal is grown by Na flux method, the GaN single crystal is susceptible to blackening due to existence of nitrogen defects.

It is also described in Japanese Patent Publication No. 2005-132663A that in growth of a nitride single crystal in a flux containing lithium, a reaction vessel which contacts with the flux is formed of metallic tantalum to thereby prevent breakage of the reaction vessel.

SUMMARY OF THE INVENTION

However, it is known that the crystal growth by such flux method using heating and pressurizing apparatus involves the following problems. Namely, in conventional growth using a muffle furnace, it is easy to prevent oxidation of raw materials by atmospheric oxygen since operations of weighting the raw materials, charging them into a crucible, and hermetically sealing the crucible in a stainless hermetic container with valve are performed within a glove box without exposing the raw materials to the atmosphere, and the hermetic container is then take out of the glove box. However, the hermetic container with valve cannot be used within the HIP apparatus. Therefore, the operation of opening and closing a pressure-resistant container of the HIP apparatus is needed to directly dispose the crucible within the container, and the raw materials may be thus oxidized by being exposed to the atmosphere during the operation.

As a result, dissolution of nitrogen at the liquid level of a growing raw material solution is inhibited to reduce the nitriding rate of gallium, and a resulting gallium nitride single crystal is blackened.

The present inventors further disclosed in Japanese Patent Application No. 2005-70649 (WO 2006/098458) to airtightly seal an opening part of a container which contains raw materials of Na flux, and lay the opening part in an open state in heating and pressurizing treatment by melting a sealant to thereby allow the inside of the container to communicate with the external non-oxidizing atmosphere.

When the crystal growth by flux method is performed using the HIP apparatus, structural parts such as a heater, a heat insulating material (furnace material) and a movable mechanism must be stored within a pressure vessel, and in a high-temperature and high-pressure area as described above, oxidation of the flux is caused by oxygen and moisture diffused from the furnace material, the heater and the like during the growth. This causes coloring of the crystal, which causes dispersion of the experimental results. The reason for the generation of oxygen or moisture during the growth is not ascertained yet, but the following factors can be considered.

(1) The flux vapor is chemically reacted with the furnace material to generate the formation of oxygen or moisture.

(2) The flux vapor is adhered to the furnace material, and the flux vapor adhered to the furnace material absorbs moisture when the container is opened to the atmosphere.

(3) The flux vapor adhered to the furnace material is then oxidized when the container is opened to the atmosphere, and the oxidized flux vapor releases oxygen at the time of heating.

An object of the present invention is to prevent deterioration of a nitride single crystal due to such oxidation of flux in growth of the nitride single crystal by the flux method.

An apparatus for producing a nitride single crystal of the present invention is adapted to grow the nitride single crystal by use of a flux including an alkali metal or alkali earth metal, the apparatus includes:

a crucible for storing the flux;

a pressure vessel for storing the crucible and charging an atmosphere containing at least nitrogen gas;

a furnace material disposed within the pressure vessel and out of the crucible;

a heater attached to the furnace material; and an alkali-resistant and heat-resistant metallic layer for covering the furnace material.

As a result of further examinations based on the above-mentioned findings, the present inventors found that the coloring of crystal due to the oxidation of flux can be remarkably prevented by covering the surface of the furnace material with an alkali-resistant and heat-resistant metallic layer, and attained the present invention. The alkali-resistant and heat-resistant metallic layer means a layer resistant to sodium vapor of 800° C.

DETAILED DESCRIPTION OF THE INVENTION

In a preferred embodiment, a crucible containing a flux is placed within a pressure vessel, and heated under high pressure by use of a hot isostatic pressing apparatus. At that time, an atmospheric gas containing nitrogen is supplied into the pressure vessel while compressing it to a predetermined pressure, so that the total pressure and nitrogen partial pressure within the pressure vessel are controlled.

In a preferred embodiment, an outer container for storing the crucible is provided within the pressure vessel. A heater container including a heater and a heat insulating material can be set further outside the outer container for further advantageously preventing contact of oxygen generated from the heater container, particularly from the furnace material to the flux.

Figure 1:
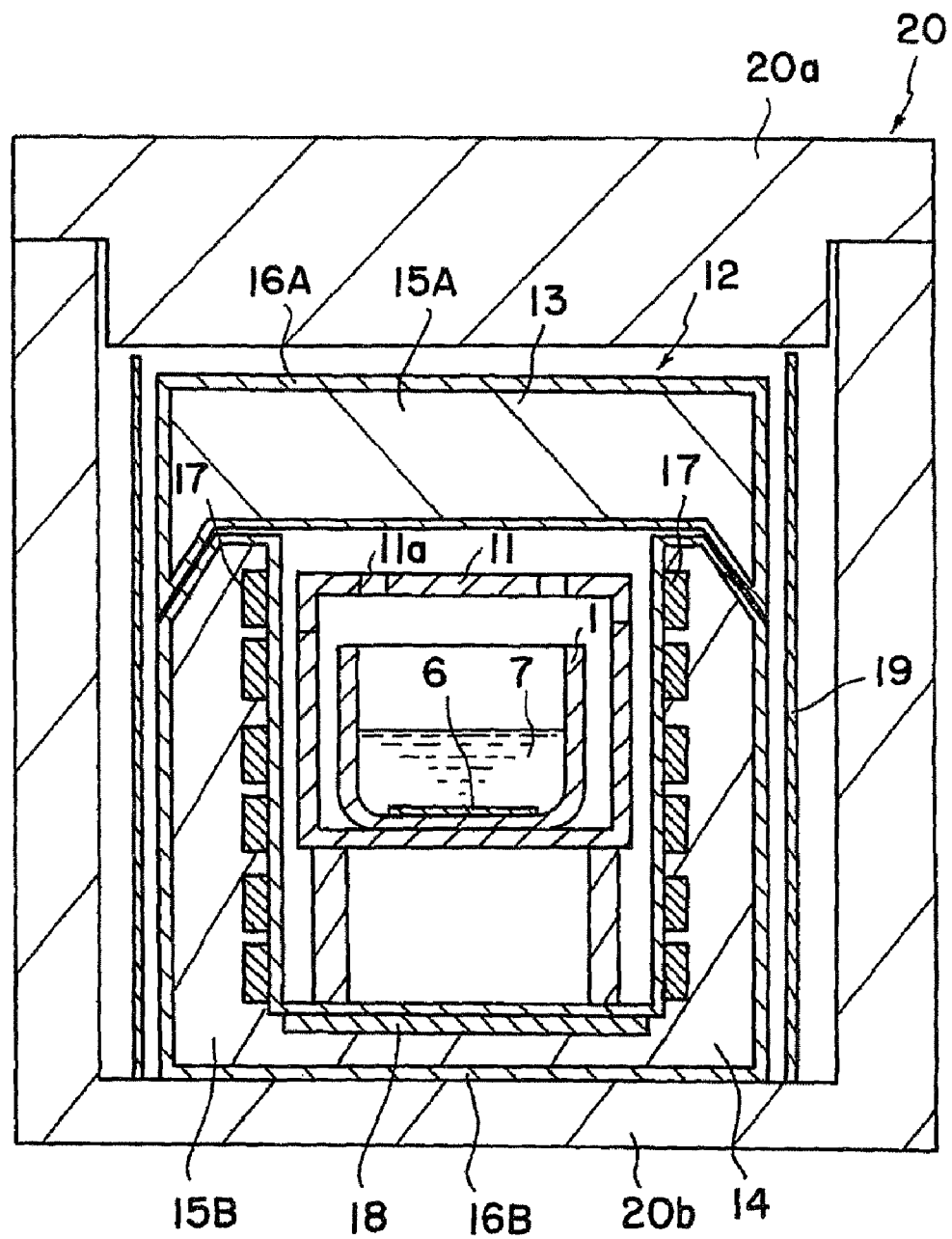
FIG. 1 is a schematic view of a growth apparatus for carrying out the present invention.

FIG. 1 schematically shows an apparatus for carrying out the present invention. A pressure vessel 20 comprises a main body 20b and a lid 20a. A heater container 12 is set inside the vessel 20. The heater container 12 comprises a lid 13 and a main body 14. The lid 13 includes a furnace material 15A and an alkali-resistant and heat-resistant metallic layer 16A which covers the surface of the furnace material 15A. The main body 14 includes a furnace material 15B and an alkali-resistant and heat-resistant metallic layer 16B which covers the furnace material 15B.

An outer container 11 is set within the heater container 12, and a crucible 1 is set within the outer container 11. A seed crystal 6 is immersed in a growing raw material solution 7 produced within the crucible 1. The lid of the outer container 11 is partially melted and extinguished at the time of heating before starting the growth to form an opening 11a.

A mixed gas cylinder not shown is provided outside the pressure vessel 20. The mixed gas cylinder is filled with a mixed gas having a predetermined composition, and the mixed gas is compressed to a predetermined pressure by a compressor and supplied into the pressure vessel 20 through a supply pipe not shown. Of this atmosphere, nitrogen is used as a nitrogen source, and an inert gas such as argon gas suppresses vaporization of flux such as sodium. The pressure of the atmosphere is monitored by a pressure gauge not shown. A heater 17 is provided on the inner circumferential surface of the furnace material 15B, and a heater 18 is provided on the bottom thereof. A cylindrical member 19 for suppressing thermal convection of the atmospheric gas is set around the outer circumference of the heater container 12.

Figure 2:
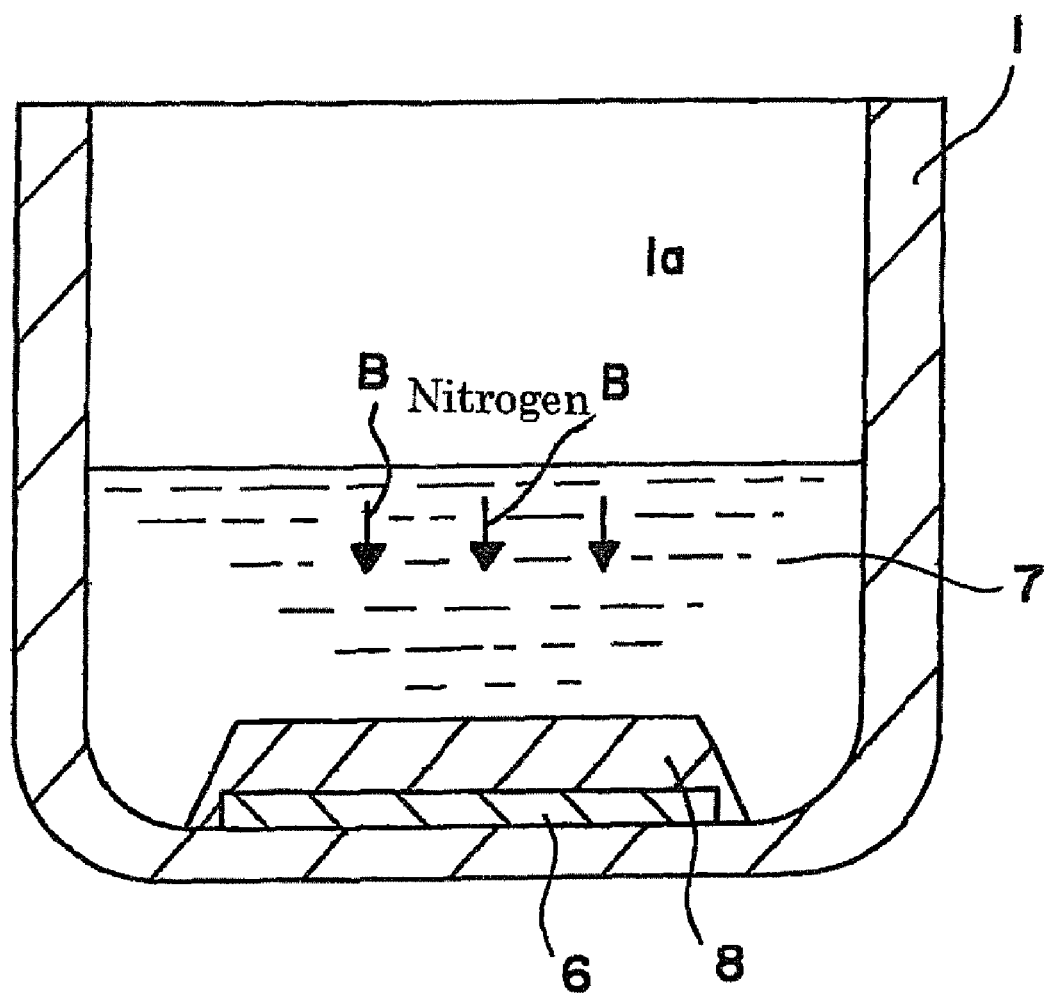
FIG. 2 is a schematic sectional view of a crucible 1, which illustrates the growing state of a single crystal 8 within the crucible 1.

When the crucible 1 is heated and pressurized within the pressure vessel 20, mixed raw materials are entirely dissolved within the crucible 1 to form the growing raw material solution 7, as shown in FIG. 2. If a predetermined single crystal growth condition is retained therein, a single crystal film 8 is grown over the seed crystal 6 with stable supply of nitrogen into the growing raw material solution 7 as shown by arrow B.

According to the present invention, since the furnace materials 15A and 15B are covered with the alkali-resistant and heat-resistant metallic layers 16A and 16B, respectively, impurities such as oxygen or moisture generated from the furnace materials during heating hardly reach the growing raw material solution 7. Consequently, the coloring or the like of crystal by oxidation of flux can be prevented.

Further, in this embodiment, since the heaters 17 and 18 are also covered with the alkali-resistant and heat-resistant metallic layer 16B, the coloring of crystal by oxidation of flux can be further effectively prevented.

Figure 3:
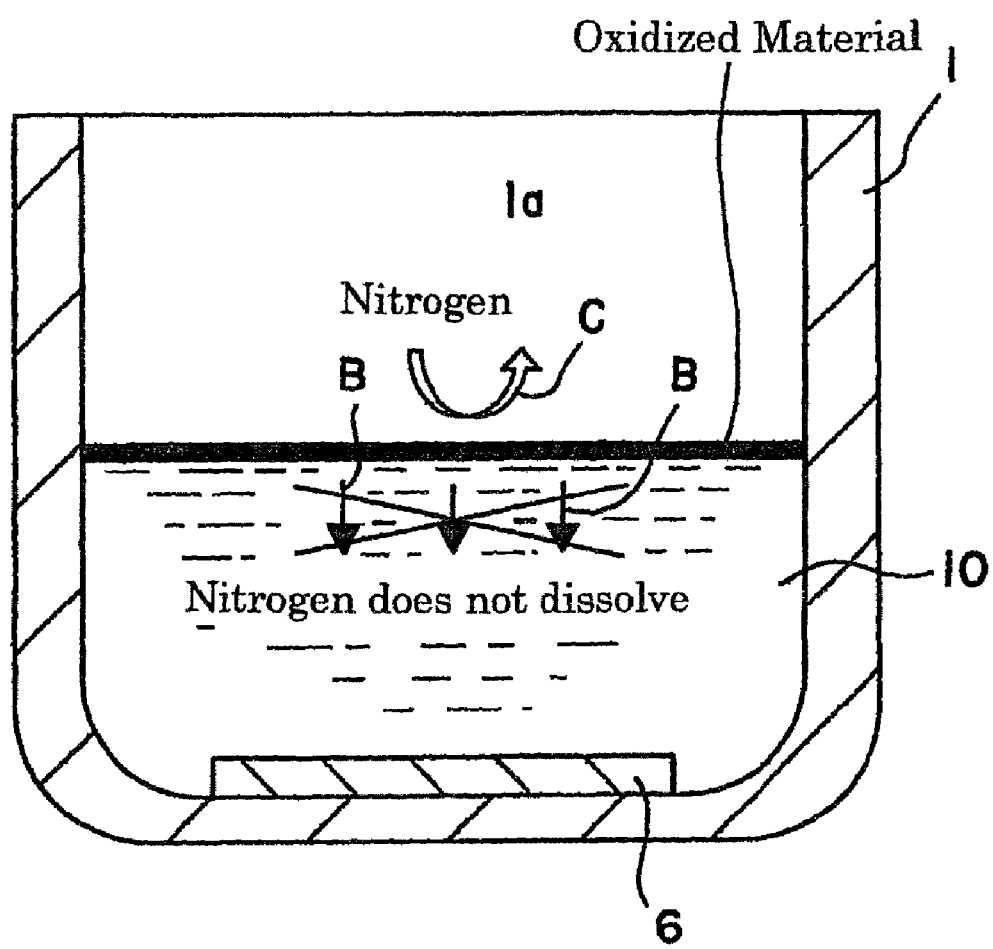
FIG. 3 is a schematic sectional view of the crucible, which illustrates the growth of the single crystal when a flux is oxidized.

In contrast, when an easily oxidizable material, for example, sodium metal is oxidized, as shown in FIG. 3, the oxidized raw material collects in the vicinity of the liquid level of a growing raw material solution 10 and disturbs the nitrogen within a space 1a from dissolving into the growing raw material solution as shown by arrow B during the heating treatment. Therefore, the nitrogen flows over the liquid level of the growing raw material solution 10 as shown by arrow C, and is not satisfactorily supplied into the growing raw material solution. Consequently, a single crystal film of good quality cannot be formed on the seed crystal 6 with good productivity, and a problem such as coloring may be caused in the resulting single crystal.

The form of the alkali-resistant and heat-resistant metallic layer is not particularly limited. The alkali-resistant and heat-resistant metallic layer may be formed of a sheet-like material. In this case, an alkali-resistant metallic plate can be joined to the furnace material surface by bonding, adhering, welding, mechanical fastening or the like. Otherwise, the alkali-resistant and heat-resistant metallic layer may be formed of a coating film applied onto the furnace material surface. Such an alkali-resistant metallic film can be formed by vaporization, sputtering, plating or the like.

A thickness of the alkali-resistant and heat-resistant metallic layer is set preferably to 0.05 mm or more, from the viewpoint of mechanical strength, more preferably to 0.2 mm or more. On the other hand, since an excessively large thickness of the alkali-resistant and heat-resistant metallic layer makes it difficult for the heat of the heater to transfer to the crucible, the thickness of the alkali-resistant and heat-resistant metallic layer is set preferably to 2 mm or less, more preferably to 1 mm or less from this point of view.

The material of the alkali-resistant and heat-resistant metallic layer is composed of a material having durability under temperature and pressure conditions necessary for growing a nitride crystal. The durability of the metallic layer means that the time to dissolution, swelling or embrittlement of the surface is long. Nitriding and discoloring of the surface of the metallic layer are permitted.

Concretely, it is preferred that dissolution, swelling or embrittlement is not caused on the surface of the metallic layer after the metallic layer is exposed to vapor of a flux containing sodium at 800° C. and 4 MPa for 100 hours. The surface of the metallic layer may be nitrided or discolored.

Concretely, a high-melting point metal such as tantalum, tungsten or molybdenum and a heat-resisting alloy such as nichorme, INCONEL (a registered trademark of Special Metals Corporation that is known as a family of austenitic nickel-chromium-based superalloys) or stainless SUS 310S are usable.

Stainless SUS 304 is not preferred since swelling, deformation and embrittlement of the surface is caused after exposure to Na vapor of 800° C. for 100 hours.

As the furnace material, for example, high alumina refractory brick (Isolite, ISO-COR (trade names), graphitic refractory (GRAFSHIELD (trade name)), and hollow spherulitic fused alumina (alumina bubble) can be used, although the material is not particularly limited thereto.

As the material of the heater, for example, tantalum, SiC, SiC-coated graphite, nichorme, and KANTHAL SUPER (trade name) can be used, although the material is not particularly limited thereto.

In the present invention, the kind of the nonoxidizing atmosphere is not particularly limited and, for example, an inert gas atmosphere of nitrogen, argon or the like and a reductive atmosphere of carbon monoxide, hydrogen or the like are adaptable. However, the present invention is particularly suitable to a nitrogenous atmosphere. The nitrogenous atmosphere may be composed of only nitrogen, but may contain a nonoxidizing gas other than nitrogen, e.g., an inert gas such as argon or a reductive gas.

In the present invention, a glove box, for example, can be used to weight the raw material mixture. The hermetic container used for heating and melting all or a part of the weighted raw material mixture in the crucible is not particularly limited. The inside of the hermetic container is retained in the above-mentioned non-oxidizing atmosphere. The pressure of this atmosphere is not particularly limited, but can be set to, for example, 0.5 KPa to 0.1 MPa.

In the present invention, the system for heating the raw material mixture to produce the flux in the single crystal growth apparatus is not particularly limited. Although a hot isostatic pressing apparatus is preferred as such system, other atmospheric pressurizing type heating furnaces are also usable.

The easily oxidizable material to which the present invention is applicable is not particularly limited. The easily oxidizable material means a material for which oxidization is easily observed when it contacts with the atmosphere at ordinary temperature, for example, a material such that the oxidization is observed within 1 minute. The easily oxidizable material may be a powder (or powder mixture) or a compact.

In a preferred embodiment, the easily oxidizable material is composed of one or more metals selected from the group consisting of alkali metals and alkali earth metals, or the alloys thereof. As such metals, sodium, lithium and calcium are particularly preferred, with sodium the most preferred.

As materials other than the easily oxidizable material to be added to the raw material mixture, for example, potassium, rubidium, cesium, magnesium, strontium, barium and tin can be given.

As a dopant, a small amount of impurity elements can be added. For example, silicon can be added as n-type dopant.

By the growing method according to the present invention, for example, the following single crystals can be suitably grown: GaN, AlN, InN, mixed crystal thereof (AlGaInN), and BN The easily oxidizable material may behave as a reactor in a predetermined reaction, or exist as one unreactive component in the flux.

The heating temperature and pressure in the single crystal growing process are not particularly limited since they are selected depending on the kind of single crystal to be grown. The heating temperature can be set, for example, to 800 to 1500° C. The pressure is not particularly limited either, and is set preferably to 1 MPa or more, more preferably to 5 MPa or more. The upper limit of the pressure is not particularly regulated, but may be set, for example, to 200 MPa or less.

The material of the crucible for performing the reaction is not particularly limited, and the crucible may be formed of an airtight material having durability under an intended heating and pressurizing condition. Examples of such material include high-melting point metals such as metallic tantalum, tungsten and molybdenum, oxides such as alumina, sapphire and yttria, nitride ceramics such as aluminum nitride, titanium nitride, zirconium nitride and boron nitride, carbides of high-melting point metals such as tungsten carbide and tantalum carbide, and thermal decomposition products such as p-BN (pyrolytic BN) and p-Gr (pyrolytic graphite).

Further concrete single crystals and growing procedures thereof will be then described.

(Growth Example of Gallium Nitride Single Crystal)

The present invention can be used to grow gallium nitride single crystal using a flux containing at least sodium metal. A gallium raw material is mixed to the flux. As the gallium raw material, gallium metal, a gallium alloy, and a gallium compound are applicable, and gallium metal is suitably used from the viewpoint of handling.

The flux can include a metal other than sodium, for example, lithium. Although the gallium raw material and the flux raw material such as sodium may be used in an appropriate proportion, excess use of Na is generally considered. This is, of course, not limitative.

In this embodiment, the growth of gallium nitride single crystal is carried out under an atmosphere consisting of a mixed gas containing nitrogen gas at a total pressure ranging from 300 atm to 2000 atm. By setting the total pressure to 300 atm or more, gallium nitride single crystal of good quality could be grown, for example, in a high-temperature range of 900° C. or higher, more preferably in a high-temperature range of 950° C. or higher. This reason is not known exactly, but is attributable to the nitrogen solubility being increased according to temperature rise, and the nitrogen efficiently dissolving into the growing solution. When the total pressure of the atmosphere is set to higher than 2000 atm, the density of the high-pressure gas gets significantly close to that of the growing solution, so that it becomes difficult to retain the growing solution within the vessel for performing the reaction of the growing solution.

TABLE 1

| Densities of various materials (g/cm$^3$) | | | |
|---|---|---|---|
| | Sodium metal | Nitrogen | Argon |
| 800° C. · 1 atm | 0.75 | 0.0003 | 0.0004 |
| 927° C. · 300 atm | | 0.08 | 0.11 |
| 927° C. · 1000 atm | | 0.21 | 0.33 |
| 927° C. · 2000 atm | | 0.3 (speculation) | 0.5 (speculation) |

In a preferred embodiment, the nitrogen partial pressure in the atmosphere during growth is set to 100 atm or more and 2000 atm or less. By setting the nitrogen partial pressure to 100 atm or more, gallium nitride single crystal of good quality could be grown in a high-temperature range of, for example, 1000° C. or higher while promoting the dissolution of nitrogen to the flux. From this viewpoint, the nitrogen partial pressure is set more preferably to 200 atm or more. The nitrogen partial pressure is set also preferably to 1000 atm or less from the practical point of view.

Although the gas other than nitrogen in the atmosphere is not particularly limited, an inert gas is preferred, and argon, helium or neon is particularly preferred. The partial pressure of the gas other than nitrogen corresponds to a value obtained by subtracting the nitrogen gas partial pressure from the total pressure.

In a preferred embodiment, the growth temperature of gallium nitride single crystal is set to 950° C. or higher, more preferably to 1000° C. or higher, and even in such a high-temperature range, gallium nitride single crystal of good quality can be grown. The growth at increased temperature and increased pressure can probably improve the productivity.

Although the upper limit of the growth temperature of gallium nitride single crystal is not particularly limited, an excessively high growth temperature makes the crystal growth difficult. Therefore, the growth temperature is set preferably to 1500° C. or lower. From this viewpoint, the temperature is set more preferably to 1200° C. or lower.

As the material of the growth substrate for epitaxially growing the gallium nitride crystal, for example, sapphire, AlN template, GaN template, silicon single crystal, SiC single crystal, MgO single crystal, spinel ($MgAl_2O_4$), and perovskite composite oxide such as $LiAlO_2$, $LiGaO_2$, $LaAlO_3$, $LaGaO_3$, or $NdGaO_3$ can be given, although the material is not particularly limited thereto. A cubic perovskite composite oxide represented by the composition formula $[A_{1-y}(Sr_{1-x}Ba_x)_y][(Al_{1-z}Ga_z)_{1-u}Du]O_3$ (wherein A is a rare earth element; D is one or more elements selected from the group consisting of niobium and tantalum; y=0.3 to 0.98; x=0 to 1; z=0 to 1; u=0.15 to 0.49; and x+z=0.1 to 2) is also usable. Further, SCAM ($ScAlMgO_4$) is also usable.

(Growth Example of AlN Single Crystal)

The present invention could be confirmed to be effective for growth of AlN single crystal by pressurizing a melt including a flux containing at least aluminum and alkali earth metal in a specific condition under a nitrogenous atmosphere.

EXAMPLES

Example 1

Growth of GaN crystal on the seed crystal substrate 6 was carried out as schematically shown in FIGS. 1 and 2. Concretely, the heater container 12 had a size of diameter 200 mm and a height of 500 mm. The furnace materials 15A and 15B were made of high alumina refractory brick, and the heaters 17 and 18 were made of nichrome. The surfaces of the furnace materials and heaters were perfectly sealed by metallic tantalum sheets 16A and 16B with a thickness of 0.5 mm. Prior to sealing, the pressure vessel 20 was heated and retained in a vacuum state to remove excessive moisture from the furnace materials and heaters. The fixation of the tantalum sheets was performed by spot welding.

Within a glove box, metal Na 90 g, metal Ga 100 g, and metal L±130 mg were weighted. The metal Ga and metal Li were enclosed by the metal Na. These raw materials were charged in an alumina-made crucible 1 with inside diameter $\phi$ of 70 mm. As the seed crystal 6, an AlN template substrate, GaN template substrate or freestanding GaN single crystal substrate with $\phi$ of 2 inches was used. The substrate was horizontally placed on the bottom of the crucible 1 so that the single crystal thin film of the template was upward, or the Ga surface of the freestanding GaN single crystal substrate was upward. The AlN template substrate is a substrate obtained by epitaxially growing an AlN single crystal thin film on a sapphire substrate in a thickness of 1 micron, and the GaN template substrate is a substrate obtained by epitaxially growing a GaN single crystal thin film on a sapphire substrate in a thickness of 3 microns.

The crucible 1 was then disposed within an outer container 11 with a hole $\phi$ 80 mm in diameter, and the outer container 11 with the hole was sealed with a plug which melts at high temperature, taken out of the glove box, and disposed within a heater container 12. The heater container 12 was then placed within a pressure vessel 20.

The pressure vessel 20 was evacuated to vacuum by a vacuum pump for removing the atmosphere within the vessel, gas-substituted by nitrogen gas, raised in temperature and pressure to 900° C. and 50 atm over one hour, and then retained at 900° C. for 100 hours. After naturally allowed to cool to room temperature, the crucible was taken out of the growth apparatus, and treated in ethanol to dissolve Na and Li. Thereafter, the remaining Ga was removed by dipping in diluted hydrochloric acid to take out the resulting GaN crystal. The GaN crystal had a substantially circular shape with a grain size of $\phi$ 2 inches and a thickness of about 5 mm. The crystal was substantially colorless and transparent. As a result of impurity analysis of the resulting crystal by EPMA (electron probe microanalysis), no oxygen was detected.

After the growth of single crystal was completed, the atmospheric pressure could be reduced to a pressure of 0.1 Pa or less, which confirmed that the amount of the moisture or oxygen left within the furnace was minimized:

The tantalum sheets used to cover the furnace materials were discolored, but not deformed, and these sheets could be repeatedly used at least 10 times or more.

Comparative Example 1

The same experiment as in Example 1 was carried out, except that the oxidation resisting metallic layers 16A and 16B for covering the furnace materials and heaters were not provided. The resulting GaN crystal had a brownish-red to black color although it transmitted light, and was not colorless and transparent. As a result of the same impurity analysis of this crystal, oxygen was detected, and intake of oxygen to the crystal was proved.

After the growth of single crystal was completed, the atmospheric pressure could be reduced only to 10 Pa or less. This shows that moisture or oxygen was left within the pressure vessel.

While specific preferred embodiments have been shown and described, the present invention is never limited by these specific embodiments, and can be carried out with various modifications and substitutions without departing from the spirit and scope of the claims of the present invention.

The invention claimed is:

1. An apparatus for growing a nitride single crystal using a flux comprising an alkali metal or alkali earth metal, said apparatus comprising:
    a crucible for storing the flux;
    a pressure vessel for containing the crucible and charging an atmosphere containing at least nitrogen gas;
    a furnace material disposed within the pressure vessel and outside of the crucible;
    a heater attached to the furnace material; and
    an alkali-resistant and heat-resistant metallic layer directly covering the furnace material.

2. The apparatus for growing a nitride single crystal of claim 1, wherein the heater is covered with the alkali-resistant and heat-resistant metallic layer.

3. The apparatus for growing a nitride single crystal of claim 1, further comprising a heater container provided within the pressure vessel to contain the crucible, the heater container containing the furnace material, the heater and the alkali-resistant and heat-resistant metallic layer.

4. The apparatus for growing a nitride single crystal of claim 1, wherein the alkali-resistant and heat-resistant metallic layer comprises a metal selected from the group consisting of tantalum, tungsten, molybdenum, INCONEL, nichorme and stainless steel SUS 310S or the alloy thereof.

* * * * *